United States Patent [19]

Sondermeyer

[11] 4,349,788

[45] Sep. 14, 1982

[54] TRANSIENT INTERMODULATION DISTORTION LIMITING CIRCUIT FOR AN AMPLIFIER SYSTEM

[75] Inventor: Jack C. Sondermeyer, Meridian, Miss.

[73] Assignee: Peavey Electronics Corp., Meridian, Miss.

[21] Appl. No.: 124,469

[22] Filed: Feb. 25, 1980

[51] Int. Cl.³ .............................................. H03F 1/34
[52] U.S. Cl. .................................... 330/293; 330/100; 330/110
[58] Field of Search .................... 330/2, 100, 110, 293

[56] References Cited

U.S. PATENT DOCUMENTS

| | | | |
|---|---|---|---|
| 3,564,444 | 2/1971 | Walsh | 330/110 X |
| 3,611,174 | 10/1971 | Day | 330/110 X |
| 3,822,408 | 7/1974 | Veranth | 330/110 X |
| 4,147,990 | 4/1979 | Dokus et al. | 330/110 X |

*Primary Examiner*—James B. Mullins
*Attorney, Agent, or Firm*—Victor J. Evans & Co.

[57] ABSTRACT

A circuit for limiting transient intermodulation distortion in a amplifier system including an operational amplifier having a gain stage and a feedback network connected between the gain stage and the amplifier feedback port together with a pair of oppositely poled diodes, connected in parallel and coupled by means of capacitors between the amplifier output port and feedback port to limit the operational amplifier going to the supply rails under non-linear conditions thereby reducing the slew rate recovery time and therefore the amount of transient intermodulation distortion.

4 Claims, 1 Drawing Figure

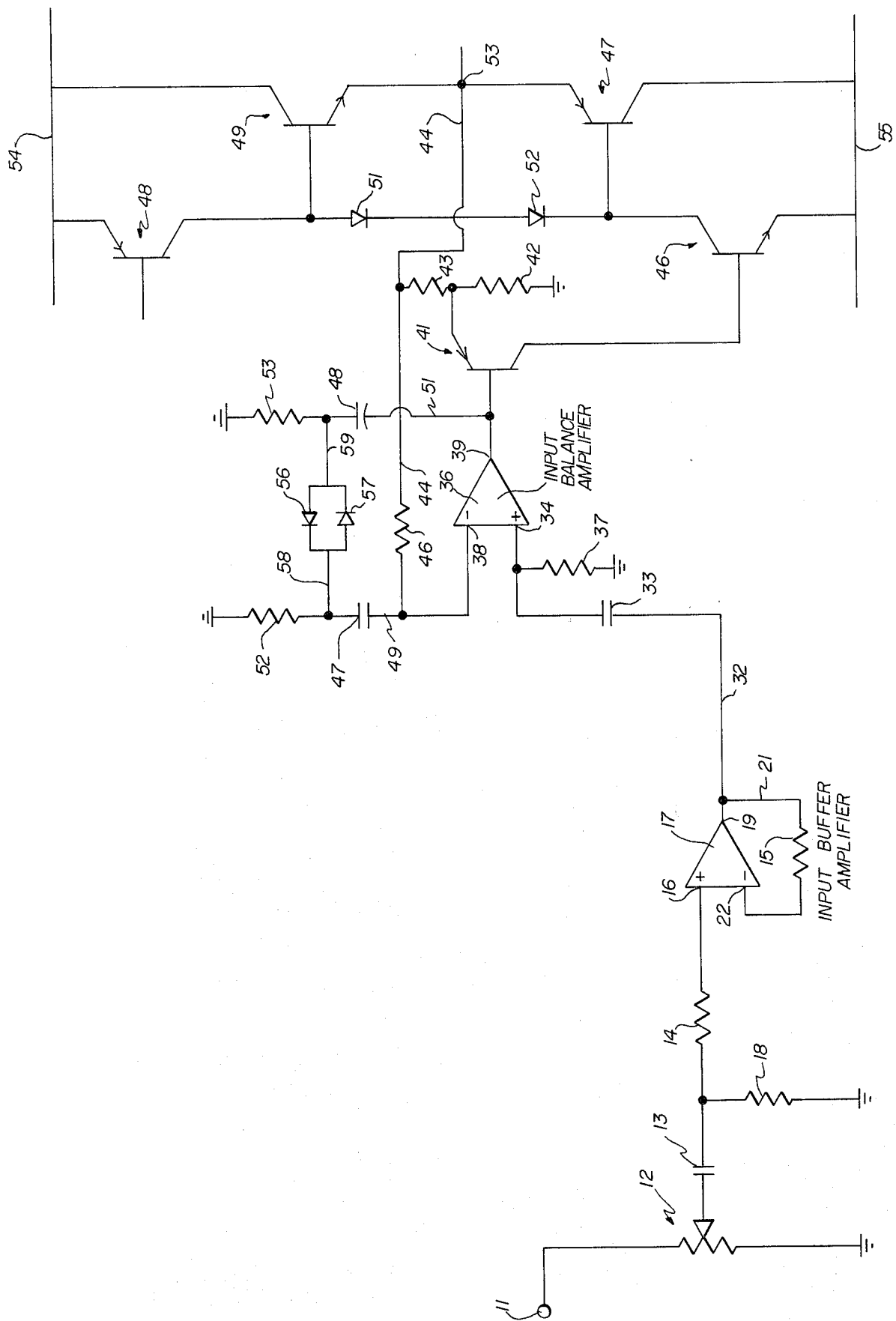

TRANSIENT INTERMODULATION DISTORTION LIMITING CIRCUIT FOR AN AMPLIFIER SYSTEM

BACKGROUND OF THE INVENTION

In the present day design of power amplifiers for driving loudspeakers and the like, the common practice is to utilize an operational amplifier in the front end of the audio system. The advantages of utilizing such an operational amplifier include the permissible use of high levels of feedback. The production of very low output off-set voltages, and a relatively high input impedance. This impedance remains constant with overload and frequency variation. In addition, the use of operational amplifier provides an economic advantage since it is available in a single integrated circuit. However, as a typical integrated circuit has relatively low supply limits, a transistor gain stage must be utilized following the operational amplifier to bring the signal level up for driving the traditional emitter follower type circuits of the complementary or quas-complementary designs. In such circuit designs, it is quite common to find supply voltages at eighty volts or higher. Now the operational amplifier will remain in the linear mode as long as the output of the power amplifier follows the input signal in a nondistorted manner.

If output clipping takes place because signal conditions exceed supply voltages or V/I limiting circuits become operational due to overloads or short circuits or slew rate limiting occurs on high slewing type signals, the input amplifier will immediately generate a nonlinear signal which will cause the output of the operational amplifier to swing to either supply rail and stay there until signal conditions are again linear. Once linear operation is established, the operational amplifier must recover at its slew rate speed back to near "O" to regain control of the amplifier. During this time, there is a so-called "dead zone" which is a nonlinear type situation presenting a common problem generally referred to as transient intermodulation (T.I.M.) distortion. To minimize such signal distortion, it is necessary to prevent the operational amplifier from going to the supply rails which is a relatively difficult action to prevent.

OBJECTS AND SUMMARY OF THE INVENTION

Accordingly, a primary object of this invention is to provide a new and novel circuit for limiting distortion of the output signal from an amplifier.

A further object of this invention is to provide a new and novel distortion limiting circuit for an amplifier system which automatically limits distortion due to transient intermodulation in the power amplifier output signal, which is simple and inexpensive in construction, which utilizes readily available component parts and which is capable of prolonged use without adjustment or maintenance.

The objects of the invention and other related objects are accomplished by the provision of an amplifier system which includes an operational amplifier having an input port, a feedback port, and a output port for providing a output signal together with means for feeding an input signal to the amplifier input port. A gain stage is connected to the amplifier output port for amplifying the output signal from the amplifier and a feedback network is connected between this gain stage and the amplifier feedback port. Circuit means are connected between the output port and the feedback port of the amplifier which reduce the slew rate recovery time of the amplifier upon the presence of a non-linear condition to thereby reduce the amount of transient intermodulation distortion in the system.

The invention will be better understood as well as further objects and advantages thereof will become more apparent from the ensuing detailed description of the preferred embodiment when taken in conjunction with the drawing.

BRIEF DESCRIPTION OF THE DRAWING

The single FIGURE of the drawing is a schematic diagram of an amplifier system incorporating the distortion limiting circuit of the invention.

DESCRIPTION OF THE PREFERRED EMBODIMENT

Referring now to the single FIGURE of the drawing, there is shown an amplifier system incorporating the distortion limiting feature of the invention which is provided with an input terminal 11 by means of which an input signal is applied to the system. The input terminal 11 is connected through a potentiometer 12 to a coupling capacitor 13 and through a resistor 14 to the noninverting input 16 of an input buffer amplifier 17. Resistor 18 is connected at one side between capacitor 13 and resistor 14 and at the other side to ground.

Buffer amplifier 17 has an output terminal 19 connected in a feedback path by means of conductor 21 including a resistor 15 to the inverting input 22.

The output 19 of buffer amplifier 17 is connected by means of the conductor 32 through a coupling capacitor 33 to the non-inverting input 34 of an input balance amplifier 36, the input 34 being also connected to ground by means of resistor 37. The input balance amplifier 36, is provided with an inverting input port 38 and an output port 39, the inverting input 38 forming the feedback port for the entire amplifier system.

In order to amplify the output signal from the input balance amplifier 36, a transistor gain stage comprising transistor 41 is provided, the base of which is connected to the output 39 of the input balance amplifier 36. The emitter of transistor 41 is connected through resistor 42 to ground and through resistor 43 to conductor 44 which is the output buss of the entire amplifier system, thereby forming one internal feedback network. Resistor 46 is connected from conductor 44 to the feedback input port 38 of the input balance amplifier 36, thereby forming the major feedback network.

The collector of transistor 41 is connected to subsequent stages associated with the amplifier system incorporating the invention which may be of conventional design including transistors 46-49 and diodes 51, 52 with output buss 44 connected into the associated circuitry at a junction 53 at which the amplifier system output signal appears. The circuitry associated with the amplifier system incorporating the invention is connected to supply rails 54, 55.

As specifically illustrative of the invention, circuit means are connected between the amplifier output port 39 and the feedback port 38 for reducing the slew rate recovery time of the amplifier 36 to thereby reduce the amount of transient intermodulation distortion. More specifically, capacitors 47 and 48 are connected by means of conductors 49, 51 to the feedback port 38 and the output port 39, respectively, for decoupling to achieve "0" D. C. conditions. The other side of capacitors 47, 48 are connected through resistors 52, 53, respectively, to ground. Additionally, resistor 52 acts to set overall system gain with its ratio to resistor 46.

The transistor gain stage including transistor 41 is adjusted to have the same gain as the overall system gain as determined by the feedback network feeding the input balance amplifier 36. This is accomplished by providing the same ratio of resistors 46 to 52 as that ratio of the transistor gain stage resistors 43 to 42. By this adjustment, the input balance amplifier 36 will operate at unity gain; i.e., the input port 34, the feedback port 38, and the output port 39 are all at the same signal level as long as linear operation is maintained.

After decoupling by capacitors 47, 48 a pair of oppositely poled diodes 56, 57 arranged in parallel relationship are connected by means of conductors 58, 59 to conductors 49, 51 respectively, so that the diodes 56, 57 are disposed between the output port 39 and the feedback port 38 of the input balance amplifier 36. Thus, when the input balance amplifier 36 attempts to go toward its power supply rails, the diodes 56, 57 will limit it in each direction to 1 $V_{BE}$(0.6 volts). Obviously, the input balance amplifier 36 will take less time to recover from this situation and thus significantly less T.I.M. distortion is encountered.

What is claimed is:

1. A distortion limiting circuit for an amplifier system having supply rails comprising, in combination, an operational amplifier having an input port, a feedback port and an output port for providing an output signal, means for feeding an input signal to said amplifier input port, a gain stage connected to said amplifier output port for amplifying the output signal from said amplifier output port, a feedback network connected between said gain stage and said feedback port, and circuit means connected between said output port and said feedback port of said amplifier for reducing the slew rate recovery time of said amplifier to thereby reduce the amount of transient intermodulation distortion, said circuit means including a pair of diodes connected in oppositely poled, parallel relationship, and a pair of decoupling capacitors respectively coupling opposite sides of said pair of diodes to said feedback port and said output port of said amplifier.

2. A distortion limiting circuit in accordance with claim 1, wherein said gain stage includes a transistor having a base connected to said amplifier output port, said feedback network includes a first pair of resistors connected between the emitter of said transistor and said amplifier feedback port, a further resistor connecting said emitter to ground and an additional pair of resistors connected at one side to ground and at their other sides to opposite sides of said pair of diodes.

3. A distortion limiting circuit for an amplifier system having supply rails comprising, in combination, an operational amplifier having an input port, a feedback port and an output port for providing an output signal, means for feeding an input signal to said amplifier input port, a gain stage connected to said amplifier output port for amplifying the output signal from said amplifier output port, a feedback network connected between said gain stage and said feedback port and circuit means connected between said output port and said feedback port of said amplifier for reducing the slew rate recovery time of said amplifier to thereby reduce the amount of transient intermodulation distortion, said circuit means including a pair of diodes connected in oppositely poled, parallel relationship, capacitive decoupling means coupling respectively opposite sides of said pair of diodes to said feedback port and said output port of said amplifier to achieve zero D.C. conditions and resistive means coupling said opposite sides of said pair of diodes to a point of reference potential.

4. A distortion limiting circuit according to claim 3, wherein said point of reference potential is ground.

* * * * *